US006674652B2

United States Patent
Forte et al.

(10) Patent No.: US 6,674,652 B2
(45) Date of Patent: Jan. 6, 2004

(54) INTEGRATED SHIELD WRAP

(75) Inventors: Steven Lo Forte, Copperton, UT (US); David Oliphant, West Jordan, UT (US)

(73) Assignee: 3Com Corporation, Santa Clara, CA (US)

(*) Notice: Subject to any disclaimer, the term of this patent is extended or adjusted under 35 U.S.C. 154(b) by 154 days.

(21) Appl. No.: 10/060,429

(22) Filed: Jan. 29, 2002

(65) Prior Publication Data

US 2003/0142482 A1 Jul. 31, 2003

(51) Int. Cl.[7] ............................................ H05K 9/00
(52) U.S. Cl. .................... 361/800; 361/816; 361/818; 361/787; 174/35 R; 174/35 GC; 439/607
(58) Field of Search ........................ 361/737, 800, 361/816, 818; 174/35 R, 35 GC, 35 MS, 32; 439/607–610

(56) References Cited

U.S. PATENT DOCUMENTS

| 2,916,720 A | | 12/1959 | Steans ........................ 339/91 |
| 4,186,988 A | | 2/1980 | Kobler ........................ 339/176 |
| 4,241,974 A | | 12/1980 | Hardesty ..................... 339/154 |
| 4,303,296 A | | 12/1981 | Spaulding ................... 339/122 |
| 4,352,492 A | | 10/1982 | Smith ............................ 273/1 |
| 4,407,559 A | | 10/1983 | Meyer ......................... 339/126 |
| 4,428,636 A | | 1/1984 | Kam et al. .................... 339/97 |
| 4,528,222 A | * | 7/1985 | Rzepecki et al. ............. 428/35 |
| 4,710,136 A | | 12/1987 | Suzuki ......................... 439/374 |
| 4,749,625 A | * | 6/1988 | Obayashi et al. ........... 428/624 |
| 4,778,410 A | | 10/1988 | Tanaka ........................ 439/676 |
| 4,829,432 A | * | 5/1989 | Hershberger et al. ....... 361/424 |
| 4,875,872 A | | 10/1989 | Tanaka ........................ 439/344 |
| 4,896,001 A | * | 1/1990 | Pitts et al. ............. 174/35 MS |
| 4,915,648 A | | 4/1990 | Takase et al. ................ 439/490 |
| 4,965,408 A | * | 10/1990 | Chapman et al. ...... 174/35 MS |
| 5,005,106 A | * | 4/1991 | Kiku ............................ 361/424 |
| 5,035,641 A | | 7/1991 | Van Santbrink ............. 439/329 |
| 5,051,099 A | | 9/1991 | Pickles et al. ............... 439/108 |
| 5,139,439 A | | 8/1992 | Shie ............................ 439/359 |
| 5,183,404 A | | 2/1993 | Aldous et al. ................. 439/55 |
| 5,184,282 A | | 2/1993 | Kaneda et al. .............. 361/395 |
| 5,310,360 A | | 5/1994 | Peterson ...................... 439/571 |
| 5,318,855 A | * | 6/1994 | Glovatsky et al. .......... 428/457 |
| 5,336,099 A | | 8/1994 | Aldous et al. ............... 439/131 |
| 5,338,210 A | | 8/1994 | Beckham et al. ........... 439/131 |
| 5,364,294 A | | 11/1994 | Hatch et al. ................. 439/676 |
| 5,391,083 A | | 2/1995 | Roebuck et al. .............. 439/76 |
| 5,391,094 A | | 2/1995 | Kakinoki et al. ............ 439/638 |
| 5,392,192 A | | 2/1995 | Dunn et al. .................. 361/683 |
| 5,394,304 A | * | 2/1995 | Jones .......................... 361/765 |

(List continued on next page.)

FOREIGN PATENT DOCUMENTS

| JP | 61-256850 | 8/1985 |
| JP | 10-156006 | 12/1990 |
| WO | WO 95/13633 | 5/1995 |

OTHER PUBLICATIONS

P.E. Knight and D.R. Smith, "Electrical Connector for Flat Flexible Cable," IBM Technical Disclosure Bulletin, vol. 25, No. 1, Jun. 1982.

*Primary Examiner*—David Martin
*Assistant Examiner*—Dameon E. Levi
(74) *Attorney, Agent, or Firm*—Workman Nydegger

(57) ABSTRACT

An integrated shield wrap suitable for use in an electronic device including electronic circuitry. The integrated shield wrap includes an insulator section composed of an electrically insulative material, as well as a shield section joined to the insulator section and composed of an electrically conductive material. The integrated shield wrap can be configured as necessary to suit a particular application and, in general, serves to electrically insulate the electronic circuitry from other circuitry and components within the electronic device while simultaneously implementing a shielding functionality that permits management of electromagnetic emissions from some or all of the electronic circuitry.

38 Claims, 3 Drawing Sheets

U.S. PATENT DOCUMENTS

| | | | |
|---|---|---|---|
| 5,398,154 A | 3/1995 | Perkins et al. | 361/212 |
| 5,411,405 A | 5/1995 | McDaniels et al. | 439/131 |
| 5,425,660 A | 6/1995 | Weikle | 439/676 |
| 5,429,522 A | 7/1995 | Noschese et al. | 439/133 |
| 5,436,803 A * | 7/1995 | Annis et al. | 361/818 |
| 5,478,261 A | 12/1995 | Bogese, II | 439/676 |
| 5,481,616 A | 1/1996 | Freadman | 381/90 |
| 5,499,923 A | 3/1996 | Archibald et al. | 439/26 |
| 5,505,633 A | 4/1996 | Broadbent | 439/329 |
| 5,509,811 A | 4/1996 | Homic | 439/55 |
| 5,538,442 A | 7/1996 | Okada | 439/67 |
| 5,546,278 A | 8/1996 | Bethurum | 361/737 |
| 5,547,401 A | 8/1996 | Aldous et al. | 439/676 |
| 5,550,713 A * | 8/1996 | Pressler et al. | 361/818 |
| 5,557,064 A * | 9/1996 | Isern-Flecha et al. | 174/35 MS |
| 5,561,727 A | 10/1996 | Akita et al. | 385/88 |
| 5,562,504 A | 10/1996 | Moshayedi | 439/638 |
| 5,580,274 A | 12/1996 | Tsair | 439/571 |
| 5,597,979 A * | 1/1997 | Courtney et al. | 174/35 R |
| 5,608,607 A | 3/1997 | Dittmer | 361/686 |
| 5,634,802 A | 6/1997 | Kerklaan | 439/131 |
| 5,660,568 A | 8/1997 | Moshayedi | 439/654 |
| 5,667,395 A | 9/1997 | Okada et al. | 439/131 |
| 5,677,511 A | 10/1997 | Taylor et al. | 174/52.2 |
| 5,679,013 A | 10/1997 | Matsunaga et al. | 439/144 |
| 5,689,878 A * | 11/1997 | Dahringer et al. | 29/841 |
| 5,696,669 A | 12/1997 | Bassler et al. | 361/816 |
| 5,727,972 A | 3/1998 | Aldous et al. | 439/655 |
| 5,739,463 A * | 4/1998 | Diaz et al. | 174/35 R |
| 5,768,110 A | 6/1998 | Frommer et al. | 361/755 |
| 5,773,332 A | 6/1998 | Glad | 439/344 |
| 5,774,344 A | 6/1998 | Casebolt | 361/800 |
| 5,775,951 A | 7/1998 | Gargiulo | 439/640 |
| 5,784,259 A | 7/1998 | Asakura | 361/752 |
| RE35,873 E | 8/1998 | Simmons et al. | 361/818 |
| 5,791,943 A | 8/1998 | Lo et al. | 439/676 |
| 5,797,771 A | 8/1998 | Garside | 439/610 |
| 5,816,832 A | 10/1998 | Aldous et al. | 439/131 |
| 5,833,473 A | 11/1998 | Betker et al. | 439/76.1 |
| 5,844,784 A | 12/1998 | Moran et al. | 361/818 |
| 5,879,170 A | 3/1999 | Nogami | 439/76.1 |
| 5,890,917 A | 4/1999 | Ishida et al. | 439/101 |
| 5,896,274 A | 4/1999 | Ishida | 361/737 |
| 5,912,806 A | 6/1999 | Onoda et al. | 361/737 |
| 5,920,460 A | 7/1999 | Oldendorf et al. | 361/753 |
| 5,940,275 A | 8/1999 | Laity | 361/737 |
| 5,966,294 A | 10/1999 | Harada et al. | 361/794 |
| 5,989,042 A | 11/1999 | Johnson et al. | 439/131 |
| 6,018,461 A | 1/2000 | Biermann et al. | 361/737 |
| 6,122,175 A | 9/2000 | Shieh | 361/737 |
| 6,152,779 A | 11/2000 | Madsen et al. | 439/676 |
| 6,333,860 B1 | 12/2001 | Oliphant et al. | 361/818 |
| 6,596,937 B2 * | 7/2003 | Mazurkiewicz | 174/35 R |
| 2001/0003347 A1 * | 6/2001 | Ortiz et al. | 361/818 |

* cited by examiner

INTEGRATED SHIELD WRAP

CROSS-REFERENCE TO RELATED APPLICATIONS

Not applicable.

BACKGROUND

1. Technological Field

The present invention relates generally to devices and systems concerned with insulation of various electronic components and the control and management of electromagnetic wave emissions. More particularly, embodiments of the present invention relate to an integrated shield wrap that may be employed in various devices and systems to facilitate effective and efficient implementation of desired shielding and insulation functionality.

2. Related Technology

Many devices include electronic circuitry that naturally emits electromagnetic waves in various frequencies. Examples of such devices include personal data assistants ("PDA"), wireless telephones, video game machines, televisions, stereo equipment, medical equipment, computers, peripheral devices such as modems and printers, and media readers, such as compact disk drives and magnetic disk drives. Additionally, various types of expansion cards, such as those conforming to Personal Computer Memory Card International Association ("PCMCIA") card standards, typically employ such electronic circuitry. In some cases, the electromagnetic waves emitted by such devices are radio frequency ("RF") waves. Generally, RF waves refer to those electromagnetic waves having frequencies above the audio range but below the visible light range, typically between 30 KHz and 300 GHz. Electromagnetic waves of various other frequencies may also be emitted by the aforementioned, and other, electronic devices.

Such emission of electromagnetic waves is problematic because electromagnetic waves, or electromagnetic radiation, oftentimes adversely affects the performance of circuitry located in the vicinity of the circuitry emitting the electromagnetic radiation, and the electromagnetic radiation may also compromise the performance integrity of the electronic equipment within which the emitting electronic circuitry is employed. The undesirable effects produced by such electromagnetic radiation are sometimes referred to as electromagnetic interference ("EMI"). Because of the aforementioned, and other, adverse effects that flow from the emission of electromagnetic radiation, it is often desirable to interpose some type of shielding between the circuitry emitting the electromagnetic radiation and the circuitry or other devices which are desired to be protected.

One factor that complicates the design and placement of such shielding, however, is that while it is desirable to shield particular electronic circuitry, it is also necessary in many cases to insulate that electronic circuitry from other circuitry or components within the device. Specifically, because shielding must be electrically conductive in order to be able to control electromagnetic radiation, the nature of shielding material is inherently incompatible with the electrically insulative material that necessarily comprises an insulator such as would be used to insulate the electronic circuitry from other circuitry or components. Notwithstanding this inherent contradiction, a variety of approaches to addressing these issues can be conceived.

For example, it may be possible to construct an insulative protective wrap having a conductive shield layered into the wrap. One drawback to such a construction, however, is that the resulting wrap would be relatively thick and thus would reduce the usable volume defined by the particular device within which the insulative protective wrap was employed. Such a drawback is particularly problematic where relatively small devices, mini-peripheral component interconnect ("PCI") expansion cards for example, are concerned.

Alternatively, a shield could be constructed so as to completely enclose the particular electronic circuitry whose electromagnetic emissions are to be managed and controlled. An insulative wrap could then be placed over the whole so as to provide the necessary insulative functionality with respect to such electronic circuitry. Such an approach however, raises some concerns.

In particular, because the shield would likely be soldered onto the printed circuit board ("PCB") wherein the electronic circuitry is located, the shield would have to be cut into, or otherwise modified or removed, using a soldering iron or other tool in the event it was desired to make modifications to the PCB electronic circuitry within the shield. Accordingly, this type of unified shield arrangement, where the shield is of a one-piece construction, implicates additional costs in the event it is desired to perform rework on the PCB circuitry. In addition to the foregoing, there is at least one other point to be considered with respect to single piece shields.

Specifically, it is sometimes necessary to melt or "reflow" the solder on a PCB so as to allow the removal of selected electronic components and/or the installation of other electronic components. However, because it is important to the effectiveness of some shields that they substantially enclose the electronic circuitry whose electromagnetic emissions are to be controlled, there is typically little or no airflow within the volume bounded by the shield. Consequently, this type of shield may prevent, or otherwise compromise, the reflow of solder connections located within the shield boundary.

As suggested above, one approach to resolving the aforementioned reflow concerns may be to perforate the shield so as to allow at least some airflow within the volume bounded by the shield, and thereby permit reflow of the solder on the components located underneath the shield. Such an approach contradicts however, the intended purpose of the shield, that is, to control and manage electromagnetic emissions from the circuitry about which the shield is deployed. Specifically, perforations in the shield would permit leakage of electromagnetic radiation produced by the circuitry, and thereby compromise the overall performance of the shield and thus, other circuitry and/or components disposed within the device wherein the shield is employed.

As an alternative to the single-piece shield constructions considered above, the shield could be constructed in a two-piece configuration, with a removable lid for example, so that in the event rework is required, the lid could simply be removed and the rework performed. The lid could then be replaced upon completion of the rework. However, this type of multi-piece construction of the shield would implicate additional, and potentially more complicated, manufacturing and assembly processes, and thus, a relative increase in the overall costs associated with the device within which the shield is to be employed.

As an alternative to producing a multi-part shield that includes a lid portion, it is possible to simply position an electrically conductive "fence" around the electronic circuitry whose electromagnetic radiation is desired to be controlled, and then place an electrically conductive "sticker" or label on top of the fence to seal off the electronic circuitry. This type of approach, however, implicates additional production costs. In particular, the placement of the fence, and then the sticker, requires two different production steps. Further, once those two steps have been performed, the insulative wrap must then be installed, adding yet a third step to the overall process. Multiple step approaches such as these complicate the manufacturing process and add to the overall cost of the device in which the shield is employed.

Accordingly, what is needed is an integrated shield wrap having features directed to addressing the foregoing exemplary considerations, as well as other considerations not specifically enumerated herein. An exemplary integrated shield wrap should be of simple construction and should be capable of, among other things, facilitating effective and efficient implementation of desired shielding and insulation functionality with respect to selected electronic circuitry contained within an electronic device.

BRIEF SUMMARY OF AN EMBODIMENT OF THE INVENTION

In general, embodiments of the invention are concerned with systems and devices useful in facilitating effective and efficient implementation of desired shielding and insulation functionality with respect to selected electronic circuitry.

In one embodiment of the invention, the integrated shield wrap is flexible and includes an insulator section composed of an electrically insulative material, and further includes a shield section joined to said at least one insulator section and composed of an electrically conductive material. The respective geometries of the insulator section and the shield section may be varied as necessary to suit the requirements of a particular application.

When the integrated shield wrap is arranged in a desired orientation with respect to selected electronic circuitry, the integrated shield wrap implements an insulative functionality that serves to electrically insulate the electronic circuitry from other circuitry and components, while simultaneously implementing a shielding functionality that permits management of electromagnetic emissions from some or all of the electronic circuitry.

These and other, aspects of embodiments of the present invention will become more fully apparent from the following description and appended claims.

BRIEF DESCRIPTION OF THE DRAWINGS

A more particular description of various aspects of the embodiments of the invention illustrated in the appended drawings will now be rendered. Understanding that such drawings depict only exemplary embodiments of the invention, and are not therefore to be considered limiting of the scope of the invention in any way, various features of such exemplary embodiments will be described and explained with additional specificity and detail through the use of the accompanying drawings in which.

DETAILED DESCRIPTION OF SELECTED EMBODIMENTS OF THE INVENTION

Reference will now be made to figures wherein like structures will be provided with like reference designations. It is to be understood that the drawings are diagrammatic and schematic representations of exemplary embodiments of the invention and, accordingly, are not to be construed as limiting the scope of the present invention in any way, nor are the drawings necessarily drawn to scale.

Figure 1:
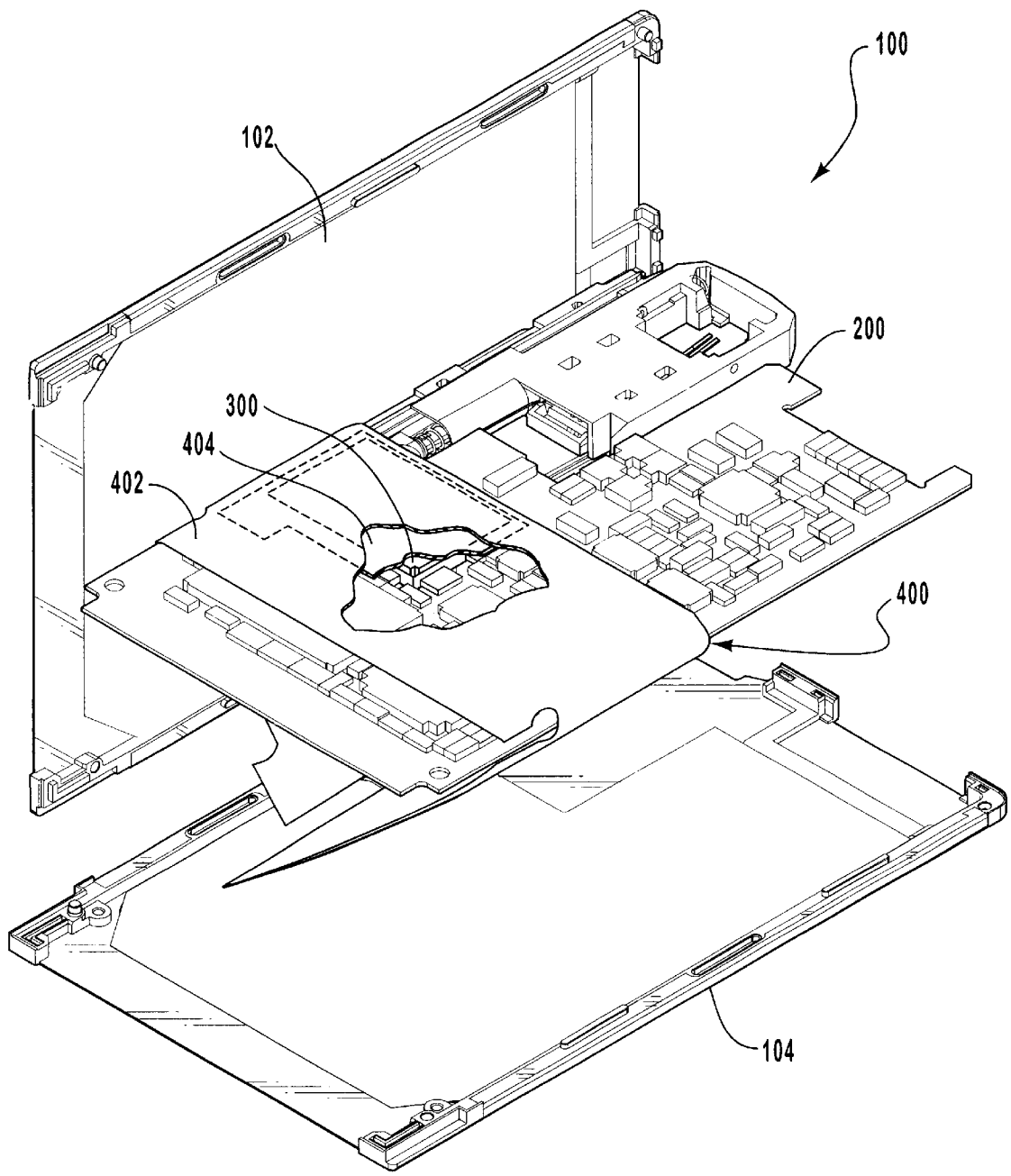
FIG. 1 is an exploded perspective view illustrating various features of an electronic device that includes an exemplary embodiment of an integrated shield wrap.

Attention is directed first to FIG. 1 where an embodiment of an electronic device is denoted generally at 100. Electronic device 100 includes, among other things, a top cover 102 and a bottom cover 104, and may comprise any type of device wherein it is desired to implement one or more aspects of embodiments of the present invention. By way of example, electronic device 100 may comprise, among other things, a PDA, wireless telephone, video game machine, television, stereo equipment, medical equipment, computer, a peripheral device such as a modem or a printer, or a magnetic or optical media reader/writer. As another example, electronic device 100 may comprise an expansion card, such as one conforming to a PCMCIA card standard or to the mini-PCI card standard. In view of the foregoing examples, the scope of the present invention should not be construed to be limited to any particular operating environment or application.

In general, electronic device 100 comprises one or more printed circuit boards 200, upon which electronic circuitry 300 is mounted or otherwise disposed. Additionally, electronic device 100 includes one or more integrated shield wraps 400, each of which may include one or more insulator sections 402 and shield sections 404, disposed in proximity to electronic circuitry 300. In at least some embodiments of the invention, PCB 200 and electronic circuitry 300 substantially conform with an established standard such as a PCMCIA standard, or the mini-PCI standard, for example. Additionally, electronic circuitry 300 may, in at least some embodiments of the invention, comprise RF or similar circuitry.

Figure 2:
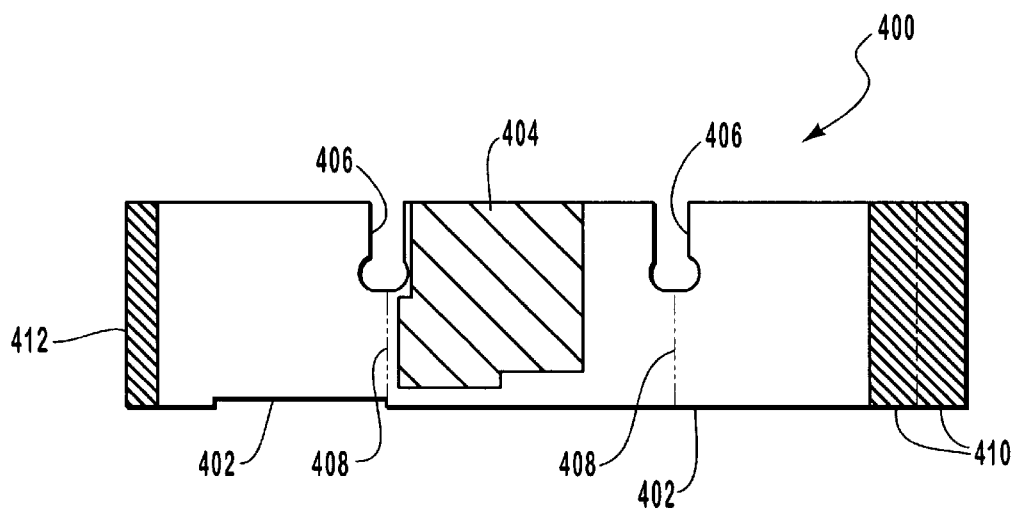
FIG. 2 is a top view illustrating various features of an exemplary embodiment of an integrated shield wrap.
Figure 3:
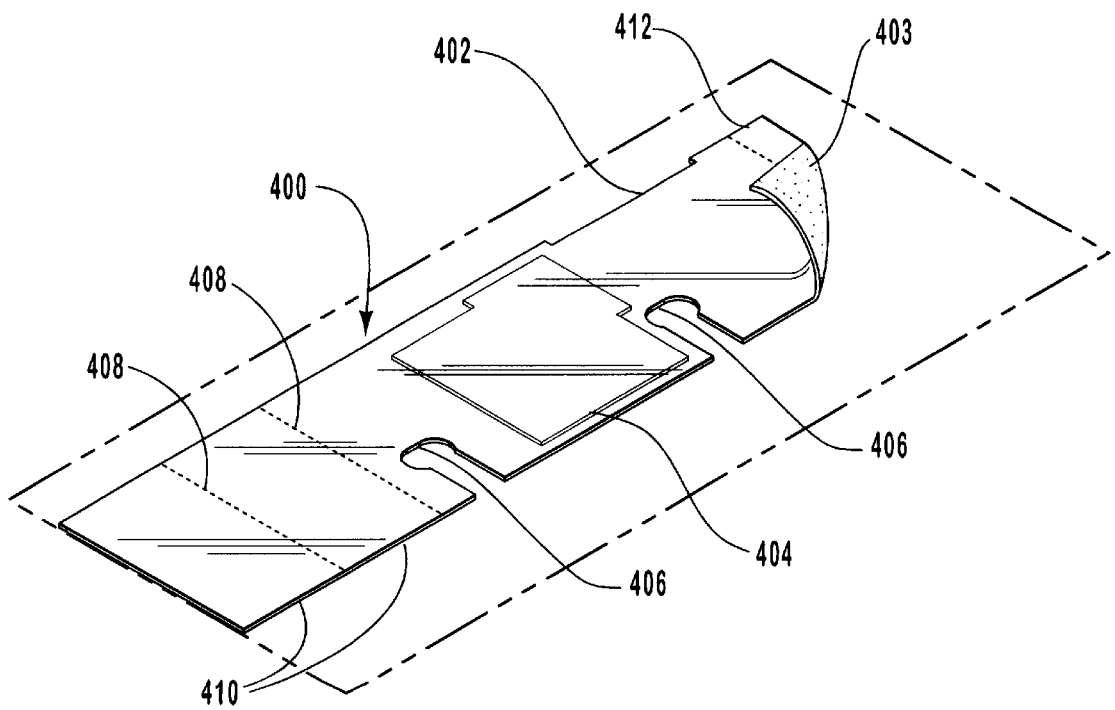
FIG. 3 is a perspective view illustrating various features of an exemplary embodiment of an integrated shield wrap.

Directing attention now to FIGS. 2 and 3, and with continuing reference to FIG. 1, details are provided regarding various aspects of an embodiment of integrated shield wrap 400. In the embodiment illustrated in FIGS. 2 and 3, integrated shield wrap 400 is displayed in a generally planar arrangement so that some of its features are more readily apparent. Note however that, as indicated elsewhere herein (in the discussion of FIG. 4, for example), at least some embodiments of integrated shield wrap 400 comprise flexible materials and can, accordingly, be readily wrapped around PCB 200 and electronic circuitry 300.

In general, integrated shield wrap 400 includes one or more insulator sections 402, and one or more shield sections 404 attached to insulator section 402. Generally, insulator sections 402 comprise a material, or combination of materials, that are substantially electrically nonconductive. The insulator sections 402 may be flexible, or rigid, as required by a particular application. Exemplary materials for insulator sections 402 include ceramic, epoxy-fiberglass laminate, glass, plastic, polyester, transformer paper, and fishpaper. However, any other material or combination of materials providing the functionality disclosed herein may alternatively be employed.

Some or all insulator sections 402 may include an adhesive, pressure-sensitive adhesive 403 for example, to permit reliable retention of integrated shield wrap 400 in a desired position and orientation with respect to PCB 200 and electronic circuitry 300. Other adhesives suitable for use in the intended environment may also be employed.

With continuing reference now to FIGS. 2 and 3, shield sections 404 comprise one or more electrically conductive materials. In some embodiments, for example, one or more of shield sections 404 comprise a metallic film substantially comprised of copper or a copper alloy. However, any other conductive material, whether metallic or non-metallic, having the functionality disclosed herein may alternatively be employed in place of copper.

In another embodiment of the invention, shield section 404 comprises an electrically conductive adhesive, which may be embodied in a variety of forms, pressure-sensitive adhesive tape for example. Such adhesives may be isotropic or anisotropic and include, but are not limited to, silicon-based thermoset elastomers that include a conductive filler such as silver (Ag), isotropic epoxies filled with silver, nickel (Ni), or gold (Au), anisotropic conductive polymers that include conductive elements such as gold-coated polymer spheres, solid metal powders such as nickel, gold, and silver, and solder type alloys. The conductive adhesives in the foregoing list are exemplary only. Thus, other conductive adhesives, may be employed that provide the functionality disclosed herein. Moreover, electrically conductive adhesives that take the form of tapes or films are simply exemplary embodiments of shield section 404, and the foregoing exemplary embodiments of shield section 400 should not be construed to limit the scope of the present invention in any way. Generally, any other structures, adhesives, or materials that provide the functionality disclosed herein may alternatively be employed.

As suggested in the embodiment of integrated shield wrap 400 illustrated in FIGS. 2 and 3, the geometry and arrangement of insulator sections 402, as well as that of shield section(s) 404, may be varied as necessary to suit the requirements of a particular application or device within which integrated shield wrap 400 is employed. Thus, the number, arrangement, orientation, thickness, and geometric configuration of insulator sections 402 and shield section 404 illustrated in FIGS. 2 and 3 are exemplary only and should not be construed to limit the scope of the present invention in any way.

With continuing reference to FIGS. 2 and 3, at least some embodiments of integrated shield wrap 400 further define include, or otherwise include, one or more cutouts 406. Cutouts 406 may be defined, for example, by insulator sections 402 and/or shield section 404. Directing attention now to FIG. 4, an exemplary arrangement of cutouts 406 permits integrated shield wrap 400 to be installed within electronic device 100 in such a way as to accommodate, for example, other components or geometric features of electronic device 100.

Variables including, but not limited to, the number, size, geometry, location, and positioning, of cutouts 406 may be varied as necessary to suit the requirements of a particular application. Further, the scope of the present invention should not be construed to be limited solely to cutouts 406. Rather, any other geometric feature, or combination of geometric features, of integrated shield wrap 400 providing the functionality of cutouts 406 disclosed herein, may alternatively be employed. In some embodiments of the invention, one or more cutouts 406 include a perforated "punchout" section (not shown) that can be removed if necessary to suit a particular application.

With continuing attention to various geometric aspects of embodiments of integrated shield wrap 400, at least some embodiments of integrated shield wrap 400 include one or more features which permit modifications to the geometry of integrated shield wrap 400. Such features, in general, permit an integrated shield wrap 400 to be readily modified or customized for use in a particular application, device, or operating environment.

Figure 4:
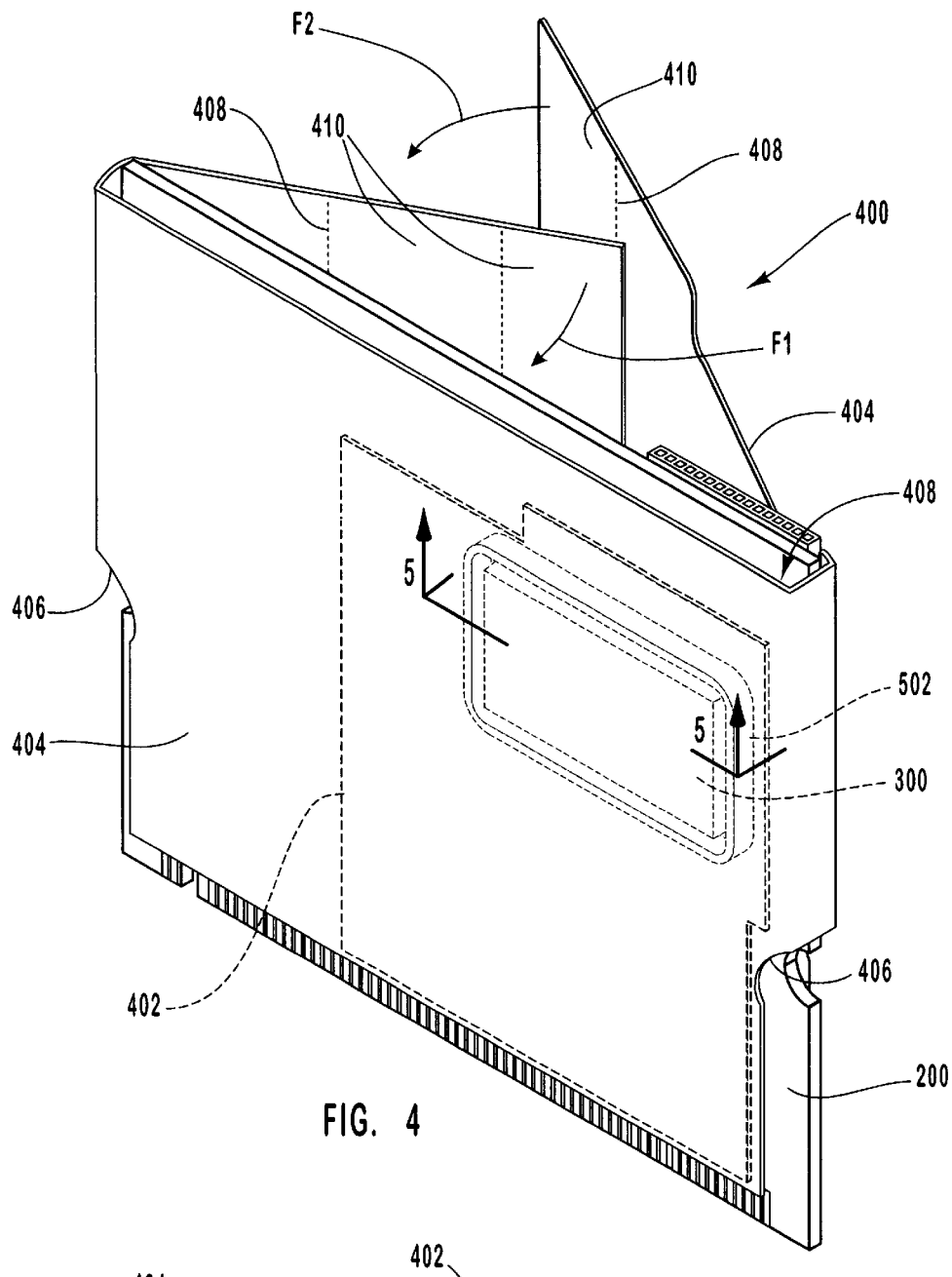
FIG. 4 is a perspective view illustrating an exemplary arrangement of an embodiment of an integrated shield wrap and a printed circuit board of an electronic device.

One example of such a feature is one or more fold lines 408 defined by integrated shield wrap 400. Fold lines 408 may be located and oriented in any way that permits integrated shield wrap 400 to be modified to conform to a particular desired shape or configuration. Similarly, features such as, but not limited to, the length and number of fold lines 408 may be varied as necessary. Various details of an exemplary folded geometry are illustrated in FIG. 4, wherein exemplary first and second folding steps are denoted at F1 and F2, respectively.

Another example of a feature which facilitates modifications to the geometry of integrated shield wrap 400 is detachable segments 410. In the embodiment of integrated shield wrap 400 illustrated in FIGS. 2 and 3, for example, integrated shield wrap 400 includes two detachable segments 410. In this exemplary arrangement, the overall length of integrated shield wrap 400 can readily be modified by removing one or more of detachable segments 410.

Because, in the illustrated embodiment, detachable segments 410 are disposed near the end of integrated shield wrap 400, such detachable segments 410 may be constructed of, or include, materials which permit integrated shield wrap 400 to be glued, soldered, or otherwise attached, to printed circuit board 200. By way of example then, one embodiment of integrated shield wrap 400 may include one or more detachable segments 410 that are coated with a suitable adhesive 403 which permits integrated shield wrap 400 to be readily attached to PCB 200. In another exemplary embodiment of the invention, detachable segments 410 may comprise, or otherwise include, a metallic material suitable for permitting attachment of integrated shield wrap 400 to PCB 200 by way of soldering or similar processes.

Some embodiments of integrated shield wrap 400 may employ, in combination with or as an alternative to, detachable segments 410, one or more attachment sections 412. Similar to detachable segments 410, attachment sections 412 may comprise or include materials that permit integrated shield wrap 400 to be glued, soldered, or otherwise attached, either permanently or removably, to PCB 200. In some embodiments, attachment sections 412 are integral with insulation sections 402 and/or shield sections 404. As in the case of cutouts 406 and fold lines 408, variables such as, but not limited to, the size, number, geometry, positioning, and orientation, of detachable segments 410 and attachment sections 412 may be modified as necessary to suit the requirements of a particular application.

As suggested above, a variety of means may be employed to perform the functions, either collective or individual, of fold line(s) 408 and detachable segment(s) 410. Thus, the embodiments of fold lines 408 and detachable segments 410, as well as cutouts 406 that initially include punchout sections, disclosed and discussed herein are but exemplary structures that function, either alone or in combination with each other, as a means for modifying a shield wrap geometry. Accordingly, it should be understood that such structural configurations are presented herein solely by way of example and should not be construed as limiting the scope of the present invention in any way. Rather, any other structure, feature, or combination of structures, that is effective in implementing the functionality disclosed herein may alternatively be employed.

With reference more generally to integrated shield wrap 400, various embodiments of integrated shield wrap 400 may include any of a variety of combinations of the features disclosed herein and the scope of the present invention should, accordingly, not be construed to be limited to the exemplary features, and combinations thereof, disclosed herein.

Further, as suggested herein, a variety of means may be employed to perform the functions of integrated shield wrap 400. Thus, the embodiments of integrated shield wrap 400 disclosed and discussed herein are but exemplary structures that function as a means for integrating circuitry insulation and shielding. It should thus be understood that such structural configurations are presented solely by way of example and should not be construed as limiting the scope of the present invention in any way. Rather, any other structure effective in implementing the functionality disclosed herein may likewise be employed.

Figure 5:
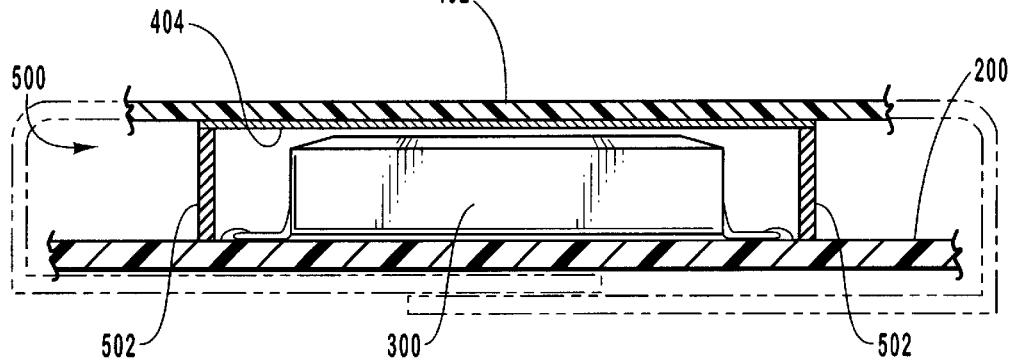
FIG. 5 is a section view taken along line 5—5 of FIG. 4, depicting various features of an embodiment of an insulating and shielding system.

Directing attention now to FIG. 5, and with continuing attention to FIG. 4, details are provided regarding various features of an embodiment of integrated shield wrap 400 as employed in the context of an exemplary electronic device 100. In some embodiments of the invention, integrated shield wrap 400 may be employed alone in order to implement the functionality disclosed herein. Alternatively, and as suggested in FIG. 5, other embodiments of the invention provide for the use of integrated shield wrap 400 in the larger context of an insulating and shielding system, denoted generally at 500.

In the embodiment illustrated in FIGS. 4 and 5, insulating and shielding system 500 includes, in addition to integrated shield wrap 400, a fence 502. Generally, fence 502 comprises an electrically conductive material, copper or steel for example. As suggested in FIG. 5, fence 502 is, exemplarily, positioned substantially perpendicularly with respect to PCB 200 and is disposed about the outer perimeter of electronic circuitry 300 whose electromagnetic emissions are to be controlled, or otherwise managed, by insulating and shielding system 500. In at least some embodiments of the invention, fence 502 is soldered to corresponding solder pads (not shown) disposed on PCB 200. In other embodiments, fence 502 may be removably attached to PCB 200 such as by clips or other structure having similar functionality. In general, the configuration and arrangement of fence 502 may be varied as necessary to suit the dictates of a particular application, device, or operating environment.

As suggested by the exemplary embodiment of insulating and shielding system 500 illustrated in FIG. 5, the size, shape, and orientation of shield section 404 of integrated shield wrap 400 is such that when integrated shield wrap 400 is positioned, the outer perimeter of shield section 404 corresponds to the shape described by fence 502. In this way, shield section 404 "caps" fence 502 so that fence 502 and shield section 404 are in electrical communication with each other and cooperate with each other to define an enclosure disposed about electronic circuitry 300 of PCB 200. As noted earlier, a single integrated shield wrap 400 may incorporate multiple shield sections. Such multiple shield sections may thus cooperate with one or more fences to facilitate management of the electromagnetic emissions of multiple groups of electronic circuitry.

Because shield section 404 is a part of integrated shield wrap 400, placement of insulator section 402 and shield section 404 can be accomplished in a single manufacturing step. Furthermore, because at least some embodiments of integrated shield wrap 400 may be removably attached to PCB 200, such as by pressure-sensitive adhesive or various structural arrangements, integrated shield wrap 400 can be readily removed in the event it is desired to perform rework on electronic circuitry 300, and/or on other circuitry present on PCB 200 but located outside the enclosure defined by shield section 404 and fence 502.

Specifically, and as suggested in FIG. 4, since shield section 404 is a part of integrated shield wrap 400, removal of integrated shield wrap 400 results in the removal of shield section 404 from fence 502, and thereby permits access not only to electronic circuitry on PCB 200 located outside of fence 502, but also permits ready access to electronic circuitry 300 disposed within the confines of fence 502.

In operation, electromagnetic radiation emitted by electronic circuitry 300 is cooperatively confined, or otherwise controlled or managed, by shield section 404 and fence 502. Further, insulator sections 402 of integrated shield wrap 400 serve to electrically insulate electronic circuitry 300 from other circuitry and/or components present within electronic device 100. In this way, the disparate functionalities of controlling electromagnetic radiation from electronic circuitry 300, while insulating electronic circuitry 300 from other electronic circuitry and/or components, are integrated within a single structure, that is, integrated shield wrap 400.

The described embodiments are to be considered in all respects only as exemplary and not restrictive. The scope of the invention is, therefore, indicated by the appended claims rather than by the foregoing description. All changes which come within the meaning and range of equivalency of the claims are to be embraced within their scope.

What is claimed is:

1. An integrated shield wrap suitable for use in an electronic device including electronic circuitry, the integrated shield wrap comprising:

(a) an insulator section substantially comprising an electrically insulative material, said insulator section having first and second opposing sides; and (b) a shield section attached to either said first or second side of said insulator section and substantially comprising an electrically conductive material, the shield section being less than coextensive with said insulator section so that some portions of the integrated shield wrap comprise a double layer configuration while other portions of the integrated shield wrap comprise only a single layer configuration, and said shield section and insulator section being arranged so that when the integrated shield wrap is operably disposed with respect to the electronic circuitry, said shield section is interposed between the electronic circuitry and said insulator section.

2. The integrated shield wrap as recited in claim 1, wherein said shield section comprises an adhesive.

3. The integrated shield wrap as recited in claim 1, further comprising at least one attachment member joined to at least one of said shield section and said insulator section.

4. The integrated shield wrap as recited in claim 1, further comprising a means for modifying a shield wrap geometry.

5. The integrated shield wrap as recited in claim 4, wherein said means for modifying a shield wrap geometry comprises at least one of: a fold line defined by either said insulator section or said shield section, and a detachable segment connected to either said insulator section or said shield section.

6. The integrated shield wrap as recited in claim 1, wherein at least one of said insulator section and said shield section defines at least one cutout.

7. An electronic device, comprising:
(a) a printed circuit board including electronic circuitry; and
(b) an integrated shield wrap disposed proximate said electronic circuitry and comprising:
  (i) an insulator section substantially comprising an electrically insulative material, said insulator section having first and second opposing sides; and
  (ii) a shield section joined to either said first or second side of said insulator section and substantially comprising an electrically conductive material, the shield section being less than coextensive with the insulator section so that some portions of the integrated shield wrap comprise a double layer configuration while other portions of the integrated shield wrap comprise only a single layer configuration, said shield section and said insulator section being arranged so that said shield section is interposed between said insulator section and said electronic circuitry.

8. The electronic device as recited in claim 7, wherein said integrated shield wrap is at least indirectly attached to said printed circuit board.

9. The electronic device as recited in claim 7, wherein said integrated shield wrap is removably attached to said printed circuit board.

10. The electronic device as recited in claim 7, wherein said electronic circuitry comprises radio frequency circuitry.

11. The electronic device as recited in claim 7, wherein said printed circuit board and said electronic circuitry generally conform to the mini-PCI standard.

12. The electronic device as recited in claim 7, further comprising a conductive fence disposed proximate to said electronic circuitry and in electrical communication with said shield section.

13. The electronic device as recited in claim 7, wherein said shield section comprises a metallic film.

14. The electronic device as recited in claim 7, wherein said shield section comprises an adhesive.

15. The electronic device as recited in claim 7, wherein said integrated shield wrap defines at least one cutout.

16. An insulating and shielding system suitable for use in conjunction with an electronic device having a printed circuit board that includes electronic circuitry, the insulating and shielding system comprising:
(a) a conductive fence configured to be attached to the printed circuit board; and
(b) an integrated shield wrap discrete from said conductive fence and including:
  (i) an insulator section substantially comprising an electrically insulative material;
  (ii) a shield section joined to said insulator section and substantially comprising an electrically conductive material, said shield section being less than coextensive with the insulator section so that some portions of the integrated shield wrap comprise a double layer configuration while other portions of the integrated shield wrap comprise only a single layer configuration; and
  (iii) means for modifying a shield wrap geometry.

17. The insulating and shielding system as recited in claim 16, wherein said means for modifying a shield wrap geometry comprises at least one of: a fold line defined by either said insulator section or said shield section, and a detachable segment connected to either said insulator section or said shield section.

18. The insulating and shielding system as recited in claim 16, wherein said shield section comprises a metallic film.

19. The insulating and shielding system as recited in claim 16, wherein said shield section comprises an adhesive.

20. The insulating and shielding system as recited in claim 16, wherein said integrated shield wrap defines at least one cutout.

21. An expansion card, comprising:
(a) a printed circuit board including radio frequency circuitry; and
(b) an insulating and shielding system including:
  (i) a conductive fence attached to said printed circuit board and disposed proximate said radio frequency circuitry; and
  (ii) an integrated shield wrap discrete from said conductive fence and in contact therewith, said integrated shield wrap being disposed proximate to said radio frequency circuitry and including:
    (1) an insulator section substantially comprising an electrically insulative material; and
    (2) a shield section joined to said insulator section and substantially comprising an electrically conductive material, said shield section being less than coextensive with the insulator section so that some portions of the integrated shield wrap comprise a double layer configuration while other portions of the integrated shield wrap comprise only a single layer configuration.

22. The expansion card as recited in claim 21, wherein said printed circuit board and radio frequency circuitry generally conform to the mini-PCI standard.

23. The expansion card as recited in claim 21, wherein said shield section comprises a metallic film.

24. The expansion card as recited in claim 21, wherein said shield section comprises an adhesive.

25. The expansion card as recited in claim 21, wherein said integrated shield wrap defines at least one cutout.

26. An integrated shield wrap suitable for use in an electronic device including electronic circuitry, the integrated shield wrap comprising:
an insulator section substantially comprising an electrically insulative material, said insulator section having first and second opposing sides;
a shield section attached to either said first side or second side of said insulator section and substantially comprising an electrically conductive material, said shield section being less than coextensive with said insulator section so that some portions of the integrated shield wrap comprise a double layer configuration while other portions of the integrated shield wrap comprise only a single layer configuration, and said shield section and insulator section being arranged so that when the integrated shield wrap is operably disposed with respect to the electronic circuitry, said shield section is interposed between the electronic circuitry and the insulator section; and
means for modifying a shield wrap geometry.

27. The integrated shield wrap as recited in claim 26, wherein said means for modifying a shield wrap geometry comprises a fold line defined by either said insulator section or said shield section.

28. The integrated shield wrap as recited in claim 26, further comprising a conductive fence disposed proximate to said electronic circuitry and in electrical communication with at least a portion of said integrated shield wrap.

29. The integrated shield wrap as recited in claim 1, wherein at least a portion of the integrated shield wrap comprises a flexible material.

30. The integrated shield wrap as recited in claim 1, wherein the shield section substantially comprises an electrically conductive adhesive selected from the group consisting of: isotropic adhesives; and, anisotropic adhesives.

31. The integrated shield wrap as recited in claim 1, wherein the shield section substantially comprises a metallic film.

32. The integrated shield wrap as recited in claim 1, wherein the insulator section substantially comprises a material selected from the group consisting of: ceramics; epoxy-fiberglass laminates; glasses; plastics; polyesters; transformer paper; and, fishpaper.

33. The integrated shield wrap as recited in claim 1, wherein the insulator section defines a plurality of portions, the shield section being attached to only one of the plurality of insulator portions.

34. The electronic device as recited in claim 7, wherein the integrated shield wrap is configured and arranged so that a first portion of the electronic circuitry resides within the integrated shield wrap, while a second portion of the electronic circuitry lies outside the integrated shield wrap.

35. The electronic device as recited in claim 7, wherein at least a portion of the integrated shield wrap comprises a flexible material.

36. The insulating and shielding system as recited in claim 16, wherein the insulator section defines a plurality of portions, the shield section being attached to only one of the plurality of insulator portions.

37. The expansion card as recited in claim 21, wherein the insulator section defines a plurality of portions, the shield section being attached to only one of the plurality of insulator portions.

38. The integrated shield wrap as recited in claim 26, wherein the insulator section defines a plurality of portions, the shield section being attached to only one of the plurality of insulator portions.

* * * * *